United States Patent [19]
Mooney et al.

[11] Patent Number: 5,635,720
[45] Date of Patent: Jun. 3, 1997

[54] RESOLUTION-ENHANCEMENT DEVICE FOR AN OPTICALLY-COUPLED IMAGE SENSOR FOR AN ELECTRON MICROSCOPE

[75] Inventors: Paul E. Mooney, San Leandro; Ondrej L. Krivanek, Lafayette, both of Calif.

[73] Assignee: Gatan, Inc., Pleasanton, Calif.

[21] Appl. No.: 539,017

[22] Filed: Oct. 3, 1995

[51] Int. Cl.[6] .................................................. H01J 37/244
[52] U.S. Cl. ........................................ 250/397; 252/488.1
[58] Field of Search .............................. 250/397, 488.1, 250/487.1, 486.1

[56] References Cited

U.S. PATENT DOCUMENTS

| | | | |
|---|---|---|---|
| 2,740,050 | 3/1956 | Schultz | 250/487.1 |
| 4,739,399 | 4/1988 | Swann et al. | 358/93 |
| 5,065,029 | 11/1991 | Krivanek | 250/441.1 |

*Primary Examiner*—Jack I. Berman
*Attorney, Agent, or Firm*—Killworth, Gottman, Hagan & Schaeff, L.L.P.

[57] ABSTRACT

An apparatus designed to be positioned in the projection chamber of an electron microscope to detect electron images and/or diffraction patterns from a sample and convert those electron images into light images is provided. The apparatus transfers light images to an imaging sensor for recording while enhancing resolution of the light images by absorbing substantially all laterally scattered light before it reaches the imaging sensor.

20 Claims, 2 Drawing Sheets

RESOLUTION-ENHANCEMENT DEVICE FOR AN OPTICALLY-COUPLED IMAGE SENSOR FOR AN ELECTRON MICROSCOPE

BACKGROUND OF THE INVENTION

The present invention relates an apparatus for use in an electron microscope and to the detection of electron images by converting them into light images and transferring them onto an electronic light-imaging device.

Electron microscopes use a beam of accelerated electrons which pass through or are deflected by a sample to provide an electron image and/or diffraction pattern of the sample. To provide a record of these images and/or diffraction patterns, the electrons have been converted into light images using scintillator materials (e.g., phosphors), and the light images and/or patterns are then captured by an imaging sensor. A transfer optic, typically one or more optical lenses or a fiber optic plate, transfers the light image to the imaging sensor. While photographic film and cameras have long been used to capture such light images and/or diffraction patterns, charge-coupled devices (CCD) of the type originally developed for astronomy to read light images into a computer have found increasing use in this field. Such CCD cameras offer excellent resolution, sensitivity, linearity, up to 2,048× 2,048 pixels, are reusable, and make the image available for viewing within seconds of recording.

A conductive medium is typically coated onto the entrance surface of the scintillator to prevent the buildup of electrical charges and also to prevent the entry of light from external sources. When the transfer optic is a fiber optic plate, the scintillator is typically glued onto the fiber optic plate, and the plate is then coupled with optical coupling oil to the imaging sensor.

The resolution of prior art devices is limited by a number of factors including the extent to which light generated at a particular spot on the scintillator is imaged onto a single pixel at the imaging sensor. Current image coupling devices lose resolution due to leakage of light sideways, either in the scintillator, the transfer optic, or both.

Accordingly, the need still exists in the art for an apparatus which will improve the ultimate resolution of image sensors used to record images from electron microscopes.

SUMMARY OF THE INVENTION

The present invention meets that need by providing an apparatus designed to be positioned in the projection chamber of an electron microscope to detect electron images and/or diffraction patterns from a sample and convert those electron images into light images. The apparatus then transfers the light images to an imaging sensor for recording while enhancing resolution of the light images.

In accordance with one aspect of the present invention, the resolution enhancement apparatus includes a scintillator located in the path of the electron beam for converting the electron image into a light image, and an imaging sensor positioned to receive and record the light image produced by the scintillator. The apparatus further includes a transfer optic associated with the scintillator for transferring the optical image to the imaging sensor. By scintillator, we mean a material which emits photons (i.e., light) in response to ionizing radiation (i.e., electrons).

The scintillator includes thereon a light absorptive layer which acts to enhance the ultimate resolution of the light image produced by the scintillator by substantially decreasing the amount of sideways reflected or scattered light from within the scintillator. The present invention addresses this light scatter problem by positioning a layer of light absorptive material at the entrance surface (the surface upon which the electrons initially impinge) of the scintillator. Light which is traveling laterally within the scintillator is absorbed or significantly reduced in intensity after reflection at the entrance surface. Any light which is reflected multiple times within the scintillator is absorbed substantially completely by the light absorptive layer.

The imaging sensor may be any suitable device which is capable of detecting a light image and producing an electronic signal. For example, the imaging sensor may be a charge-coupled device (CCD) or a television camera tube. The apparatus may also include a conductive coating over the light absorptive layer, and/or a conductive coating positioned between the scintillator and the transfer optic. Such conductive coatings function to prevent electrical charge buildup from the incident electrons on the apparatus.

The transfer optic is preferably a fiber optic plate. However, a system of lenses may also be used. The scintillator is preferably a single crystal of yttrium-aluminum-garnet (YAG). However, other suitable single crystals or polycrystalline materials may be used. The scintillator may also be in particulate form such as powdered phosphor material.

Accordingly, it is a feature of the present invention to provide an apparatus designed to be positioned in the projection chamber of an electron microscope to detect electron images and/or diffraction patterns from a sample and convert those electron images into light images and enhancing resolution of those light images for display. This, and other features and advantages of the present invention, will become apparent from the following detailed description, the accompanying drawings, and the appended claims.

DETAILED DESCRIPTION OF THE PREFERRED EMBODIMENT

Figure 1:
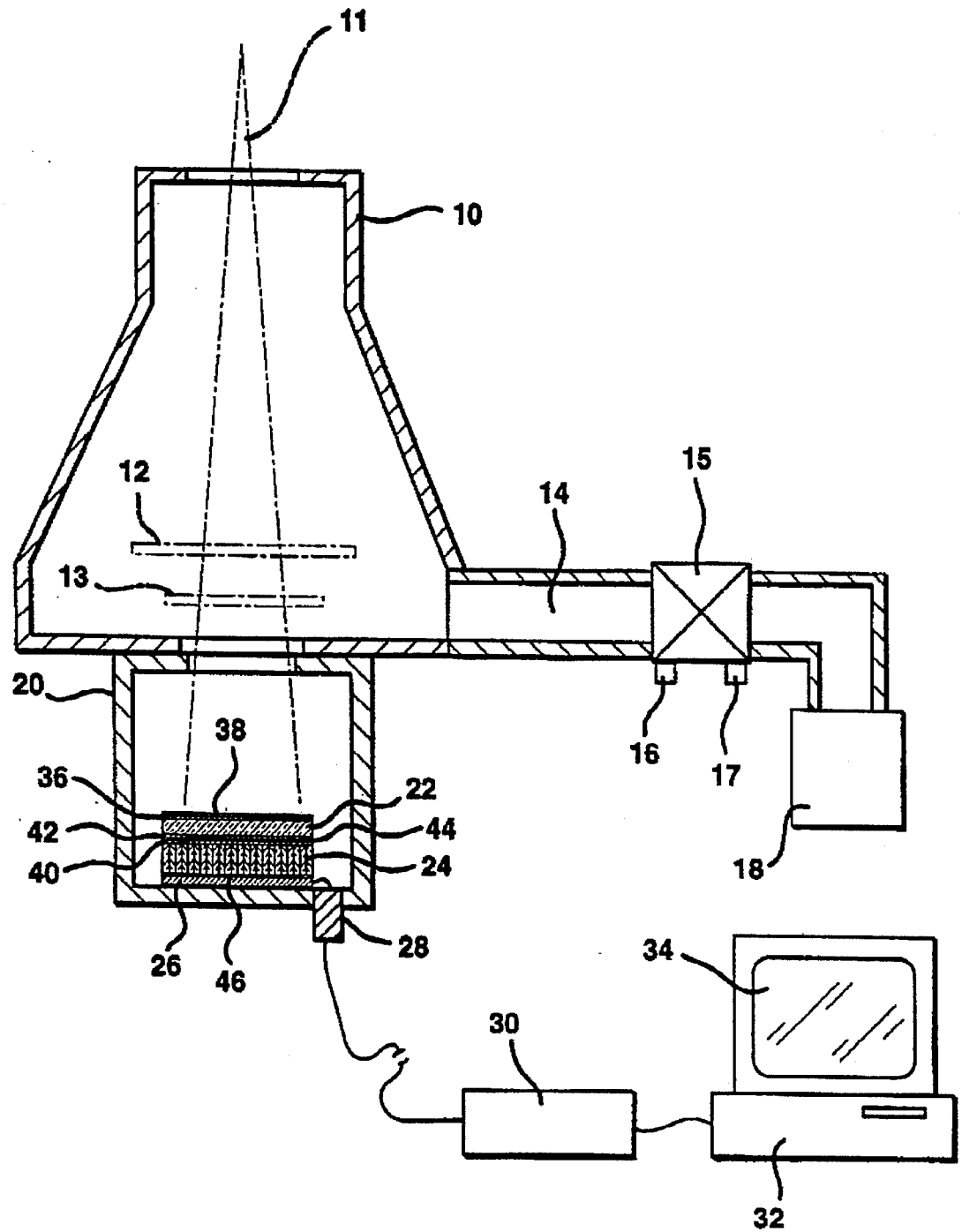
FIG. 1 is a schematic cross-sectional view of the apparatus of the present invention positioned in the projection chamber of an electron microscope.

Referring now to FIG. 1, a schematic view of a typical use of the present invention is shown in which an imaging device such as a charge-coupled device (CCD) camera 20 is mounted on the projection chamber 10 of a transmission electron microscope (TEM). As will be appreciated, the apparatus of the present invention may also find use in a scanning electron microscope (SEM), or a scanning, transmission electron microscope (STEM) as well. Typically, the projection chamber is attached to the end of an optical column of a TEM and houses a viewing screen 12 which is either lowered into an observation position or raised into a position in which it does not intercept electron beam 11 which is projected into the chamber. The projection chamber may also house a film magazine comprising a transport mechanism (not shown) which inserts a sheet of photographic film 13 into an exposure position and returns the sheet into the magazine after exposure.

The typical projection chamber further has several ports suitable for attaching an imaging device such as a camera, one of which is usually situated at the bottom of the chamber. The chamber is normally evacuated via a vacuum pipe 14 leading to a gate valve 15 which can either open or close the chamber to a high vacuum (e.g., $10^{-6}$ torr) pump 18. The gate valve in most modern TEMs is controlled pneumatically via two inlets 16 and 17 such that introduction of pressurized air into one inlet causes the valve to open, and the introduction of pressurized air into the other inlet causes the valve to close.

An electron beam 11 forming an electron image or diffraction pattern from a specimen in the microscope traverses the projection chamber 10. Camera 20 includes a scintillator 22 which converts the electron image into a light image. Scintillator 22 is supported on a transfer optic such as fiber optic plate 24. By light image, we generally mean light in the visible spectrum, although there are some scintillation materials which can produce light outside of the visible spectrum in either the near infrared or in the ultraviolet regions of the spectrum. It is within the scope of the present invention to use scintillator materials which produce images in the infrared, visible, and/or ultraviolet portion of the spectrum.

Fiber optic plate 24 is optically coupled to an imaging sensor such as a two-dimensional charge-coupled device (CCD) sensor 26 with an optically-coupling oil layer 46. Such CCD sensors are commercially available from several manufacturers including Kodak, Ford, Scientific Imaging Technologies (SITe), Hamamatsu, Thomson CSF, and English Electric Valve Ltd. Preferred solid-state imaging devices are scientific grade CCDs whose imaging areas comprise 1024×1024 or more pixels. However, it should be appreciated that any imaging device which is capable of capturing a light image and producing an electronic signal may be utilized including a television camera tube.

The preferred CCD must be operated cold to keep its dark current small enough so that the noise in the dark current accumulated during a typical exposure does not limit the performance of the camera. The typical exposure in an electron microscope is from about 1 to 20 seconds. Maintaining the CCD at a temperature of about −25° to about −40°C. is typically sufficiently low for the accumulated dark current to be acceptably small at exposure times of up to about 1 minute. Such a temperature is conventionally achieved using a thermoelectric cooling device (not shown), whose cold side may be in contact with the imaging sensor 26.

The CCD is connected to an external electronics unit 30 through a vacuum feed-through 28 which transfers the captured images to the memory of a digital computer 32. The images may be displayed on a view screen 34, such as a CRT, attached to the computer. For the present invention, the images may be digitized with 14 bit dynamic range at 450 kHz and then displayed by a Power Macintosh computer using Digital/Micrograph software commercially available from Gatan, Inc., Pleasanton, Calif. Other details of operation are set forth in commonly-owned U.S. Pat. No. 5,065,029, the disclosure of which is incorporated by reference.

Figure 2:
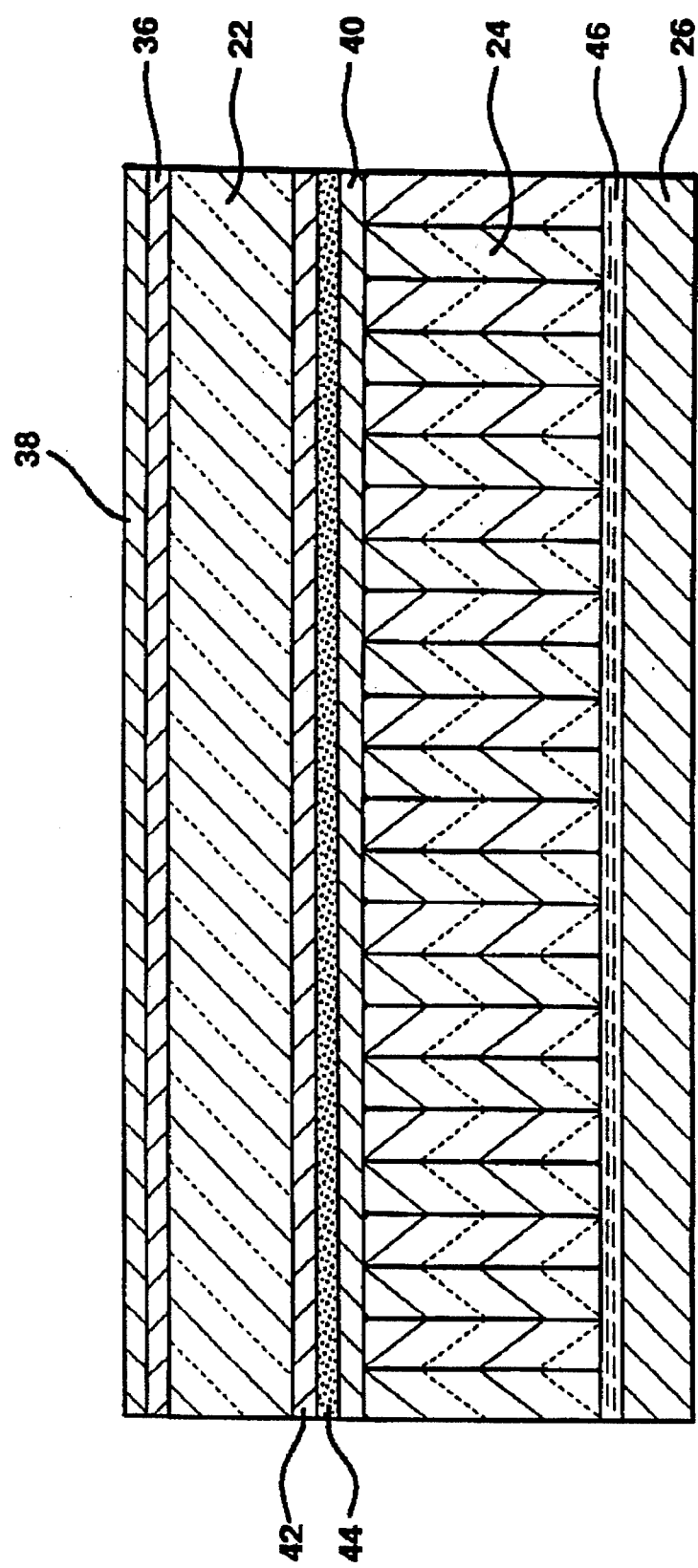
FIG. 2 is an enlarged schematic cross-sectional view of the apparatus of the present invention.

Referring now to FIG. 2, the resolution enhancement apparatus of the present invention is illustrated in greater detail. The resolution enhancement device includes scintillator 22 supported by a transfer optic such as fiber optic plate 24. In a preferred form scintillator 22 comprises a single crystal such as a yttrium-aluminum-garnet crystal. Such crystals can be manufactured to a thickness of from about 5 to 50 μm. However, it should be recognized that other scintillators may be used including polycrystalline materials and particulate materials. For example, a powdered phosphor may be coated onto the fiber optic plate to form the scintillator. Generally, particle sizes for the phosphor should be 1 μm or less, and the coating applied to a thickness of between about 1 to 25 μm to minimize random electron and light scatter from the particles.

As the transfer optic, fiber optic plates are commercially available and include glass fibers which are clad on their surfaces with another glass having a slightly lower melting point so that the fiber bundle can be heated, the cladding softened, and the bundle of fibers consolidated into a plate. Typically, such fiber optic plates have a thickness on the order of a few millimeters and diameters up to about 40 mm. Further, by using additional absorbent material in the fiber bundles or coated onto the cladding, more stray, scattered light will be absorbed, further enhancing the resolution achieved by the device. While a fiber optic plate is preferred as the transfer optic, it should be recognized that other transfer optics may be used including optical lens systems.

Referring back again to FIG. 2, scintillator 22 includes thereon a light absorptive layer 36 which acts to improve the ultimate resolution of the light image produced by the scintillator. It does so by absorbing reflected scattered light from the scintillator which would otherwise degrade the image quality received at the imaging sensor 26. Light which is traveling laterally within scintillator 22 is absorbed or significantly reduced in intensity after reflection at the entrance surface and absorption by layer 36.

Any light which is reflected multiple times within the scintillator is absorbed substantially completely by the light absorptive layer. Thus, where scintillator 22 comprises a single crystal YAG, multiple light reflections due to total internal reflection between the opposing surfaces of the crystal will be absorbed by light absorptive layer 36 at the surface of the scintillator.

Where polycrystalline or particulate scintillation materials are used, light scattering due to total internal reflection would not present a problem. However, absorptive layer 36 functions to absorb randomly scattered light from the scintillator material surfaces again to prevent such laterally-displaced light from reaching imaging sensor 26. Light absorptive layer 36 may be formed of any material which is a good absorber of light. A preferred material is carbon which can be deposited as a thin layer over scintillator 22.

Also as shown in FIG. 2, the apparatus of the present invention may optionally include a conductive coating 38 over light absorptive layer 36. The conductive coating may comprise a thin layer of a conductive metal such as aluminum which is transparent to electrons. The conductive coating performs a dual function. First, the coating will prevent the buildup of electrical charges on the apparatus which could discharge and cause arcing. Second, the coating is opaque to external light sources and prevents such light from entering the apparatus.

A second conductive coating layer 40 may also optionally be positioned adjacent fiber optic plate 24. Again, layer 40 will function to prevent the buildup of electrical charges which could adversely affect the operation of the device by draining away any excess electrons. However, such a second layer needs to be both electrically conductive as well as transparent to visible light because of its location. A suitable coating material for layer 40 is indium tin oxide.

Also shown in FIG. 2 is an optional antireflection coating layer 42 located adjacent the bottom surface of scintillator 22. Antireflection coating 42 serves simultaneously to increase the amount of light which escapes from scintillator 22 in the direction towards imaging sensor 26 while decreasing the amount of light which is reflected internally within scintillator 22. Suitable materials for the antireflection coating include those materials which are transparent to light and which have indices of refraction intermediate those of the scintillator material and adhesive layer 44. By selecting the refractive index of coating 42 to be intermediate that of the two materials on its opposing sides, sharp changes in refractive index at the layer interfaces are avoided.

Scintillator 22 and fiber optic plate 24 are secured together using an adhesive or glue layer 44. Generally, any material which has adhesive properties and which is transparent to light may be used. A preferred adhesive material is epoxy resin applied in a very thin layer (on the order of 1 μm in thickness).

Finally, as previously described, fiber optic plate 24 may be optically coupled to imaging sensor 26 using a fluid oil 46. Such an oil, selected to have an index of refraction the same as or very close to that of the glass in fiber optic plate 24, improves the transmission of light between fiber optic plate 24 and imaging sensor 26. Further, as imaging sensor 26 will be operated at relatively low temperatures, as described above, the coupling oil should have a low freezing point so that it will remain fluid at temperatures down to about −40°C.

Referring now back to FIG. 1, in operation, an electron image or diffraction pattern 11 from a sample (not shown) traverse projection chamber 10 and impinges on scintillator 22. Electrons in the beam which collide with the scintillation material produce corresponding light photons which travel towards fiber optic plate 24. Light which is randomly scattered, reflected internally within scintillator 22, or deflected laterally and reflected is substantially completely absorbed by light absorptive layer 36.

The light image is then directed to imaging sensor 26 through the transfer optic, fiber optic plate 24. Once the image impinges on sensor 26, it is detected and then displayed on view screen 34 of digital computer 32. Because substantially all of the laterally scattered light has been absorbed previously, the image resolution is enhanced.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. An apparatus for improving the resolution of electron images comprising: an electron beam forming an electron image, a scintillator located in the path of said electron beam for converting said electron image into a light image, and an imaging sensor positioned to receive and record said light image, said apparatus further including a transfer optic associated with said scintillator for transferring said light image to said imaging sensor, and a light absorptive layer on said scintillator positioned to absorb reflected scattered light from said scintillator.

2. An apparatus as claimed in claim 1 in which said imaging sensor is a charge-coupled device.

3. An apparatus as claimed in claim 1 in which said imaging sensor is a television camera tube.

4. An apparatus as claimed in claim 1 further including a conductive coating on said light absorptive layer.

5. An apparatus as claimed in claim 1 further including a transparent conductive layer positioned between said scintillator and said transfer optic.

6. An apparatus as claimed in claim 1 in which said transfer optic comprises a fiber optic plate.

7. An apparatus as claimed in claim 1 in which said transfer optic comprises an optical lens.

8. An apparatus as claimed in claim 1 in which said scintillator comprises a yttrium-aluminum-garnet crystal.

9. An apparatus as claimed in claim 1 in which said scintillator comprises a coating of a particulate phosphor.

10. An apparatus as claimed in claim 1 further including an antireflective coating layer on said scintillator.

11. In an electron microscope having a projection chamber through which an electron beam forming an electron image and/or diffraction pattern traverses, an apparatus for improving the resolution of images produced by said electron microscope and positioned in said projection chamber to intercept said electron beam comprising:

a scintillator located in the path of said electron beam for converting said electron image into a light image, and an imaging sensor positioned to receive and record said light image, said apparatus further including a transfer optic associated with said scintillator for transferring said light image to said imaging sensor, and a light absorptive layer on said scintillator positioned to absorb reflected scattered light from said scintillator.

12. An apparatus for improving the resolution of electron images comprising: an electron beam forming an electron image, a scintillator located in the path of said electron beam for converting said electron image into a light image, and an imaging sensor positioned to receive and record said light image, said apparatus further including a transfer optic associated with said scintillator for transferring said light image to said imaging sensor, a light absorptive layer on said scintillator, and a transparent conductive layer positioned between said scintillator and said transfer optic.

13. An apparatus as claimed in claim 12 in which said imaging sensor is a charge-coupled device.

14. An apparatus as claimed in claim 12 in which said imaging sensor is a television camera tube.

15. Art apparatus as claimed in claim 12 further including a conductive coating on said light absorptive layer.

16. An apparatus as claimed in claim 12 in which said transfer optic comprises a fiber optic plate.

17. An apparatus as claimed in claim 12 in which said transfer optic comprises an optical lens.

18. An apparatus as claimed in claim 12 in which said scintillator comprises a yttrium-aluminum-garnet crystal.

19. Art apparatus as claimed in claim 12 in which said scintillator comprises a coating of a particulate phosphor.

20. An apparatus as claimed in claim 12 further including an antireflective coating layer on said scintillator.

* * * * *